United States Patent
Katagiri et al.

(10) Patent No.: US 7,939,377 B1
(45) Date of Patent: May 10, 2011

(54) METHOD OF MANUFACTURING SEMICONDUCTOR ELEMENT MOUNTED WIRING BOARD

(75) Inventors: Fumimasa Katagiri, Tempe, AZ (US); Akihiko Tateiwa, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 12/913,105

(22) Filed: Oct. 27, 2010

(30) Foreign Application Priority Data

Oct. 30, 2009 (JP) .................................. 2009-250567

(51) Int. Cl.
*H01L 21/00* (2006.01)
*H05K 1/18* (2006.01)
(52) U.S. Cl. .................... 438/121; 361/753; 174/266
(58) Field of Classification Search .................. 438/121; 174/255, 256, 266; 361/748, 753
See application file for complete search history.

(56) References Cited

U.S. PATENT DOCUMENTS

| 5,937,512 | A  | * | 8/1999  | Lake et al. .................... 29/832 |
| 6,075,701 | A  | * | 6/2000  | Ali et al. ........................ 361/704 |
| 6,734,534 | B1 |   | 5/2004  | Vu |
| 7,078,788 | B2 |   | 7/2006  | Vu |
| 7,705,245 | B2 | * | 4/2010  | Miyamoto et al. ............ 174/260 |
| 2002/0020898 | A1 |   | 2/2002 | Vu |
| 2009/0277677 | A1 | * | 11/2009 | Fjelstad et al. ............... 174/260 |
| 2010/0175917 | A1 | * | 7/2010 | Miyasaka et al. ............. 174/266 |

FOREIGN PATENT DOCUMENTS

WO    WO 02/15266 A2    2/2002
WO    WO 02/33751 A2    4/2002

* cited by examiner

*Primary Examiner* — W. David Coleman
(74) *Attorney, Agent, or Firm* — Kratz, Quintos & Hanson, LLP

(57) ABSTRACT

A semiconductor element sealed substrate including a semiconductor element covered by an insulating layer is fabricated while a wiring substrate formed by stacking wiring layers is fabricated by a process different from the process of fabricating the semiconductor element sealed substrate. Next, the semiconductor element sealed substrate and the wiring substrate are stacked on each other in such a way that electrode terminals of the semiconductor element and corresponding conductive bumps on the outermost wiring layer face each other. The electrode terminals and the conductive bumps are thus connected to each other.

8 Claims, 7 Drawing Sheets

METHOD OF MANUFACTURING SEMICONDUCTOR ELEMENT MOUNTED WIRING BOARD

CROSS-REFERENCE TO RELATED APPLICATION

This application is based upon and claims the benefit of priority of the prior Japanese Patent Application No. 2009-250567 filed on Oct. 30, 2009, the entire contents of which are incorporated herein by reference.

FIELD

The embodiments discussed herein are related to a method of manufacturing a semiconductor element mounted wiring board. More particularly, they relate to a method of manufacturing a wiring board (semiconductor element mounted wiring board) in which a semiconductor element (chip) is embedded and mounted to meet a reduction in thickness and increase in performance (functionality) of the wiring board.

Such a wiring board is also referred to as a "semiconductor package" or simply "package" in the following description for the sake of convenience since the wiring board includes a semiconductor element (chip) mounted therein.

BACKGROUND

In recent years, the performance (functionality) of electronic devices using a semiconductor device (package) having a semiconductor element (chip) mounted therein has been increasing. Accordingly, there are demands for an increase in density in the mounting of semiconductor chips on a wiring board in such a semiconductor device, and a reduction in size (particularly, in thickness) and footprint of the board having the chips mounted therein. For this reason, wiring boards having semiconductor elements embedded and mounted therein have been proposed, and various structures and methods for such wiring boards have been proposed as well.

As a form of the aforementioned wiring boards, there is a wiring board called a bumpless mounting board. The bumpless mounting board uses a substrate in which diced semiconductor elements are embedded and sealed (fixed) by resin (such as an epoxy-based resin or phenol resin containing filler) while electrode pads (terminals) of each semiconductor element are exposed on the surface thereof. In addition, wiring layers are stacked on the resin used to seal the semiconductor element and also on the semiconductor element.

In the structure (process) described above, the semiconductor element and the wiring layers can be connected to each other in the course of the process of stacking layers on the substrate with copper plating or the like. Accordingly, no solder connection (bumps) between the semiconductor element and the wiring board is required in this case, the solder connection required in flip-chip connection performed when a general semiconductor element mounted board (wiring board on which a semiconductor element is surface-mounted) is formed. Thus, such a process allows formation of a semiconductor package thinner than a semiconductor package using an existing thin-core substrate or coreless substrate requiring flip-chip connection. In addition, the inductance of the semiconductor element mounted wiring board is reduced in this case because of the thickness reduction. Thus, such a board is very effective in terms of the power supply characteristics.

In addition, a package with a package-on-package (POP) structure formed by stacking such bumpless mounting boards (packages) one on top of another in the height direction of the boards is expected to be thinner than that with a POP structure of the current technology (structure in which semiconductor element mounted boards requiring flip-chip connection are stacked one on top of another).

As an example of techniques relating to the aforementioned conventional art, there is known a technique used in a small electronic package in which a small electronic component (die) having an active surface and a side surface is sealed. With this technique, a sealing member having a surface substantially in parallel with the active surface of the die is arranged adjacent to the side surface of the die (International Publication Pamphlet No. WO 02/15266).

As another known technique, there is a technique used in a small electronic board in which a small electronic component (die) is sealed. With this technique, the die is arranged at an opening portion of a board core, and an area of the opening portion, which is not occupied by the die, is filled with a sealing member (International Publication Pamphlet No. WO 02/33751).

As described above, in the structure (process) of the conventional semiconductor element mounted board, the semiconductor element sealed by resin is used as the base substrate, and the wiring layers are sequentially stacked on the base substrate (on the resin used for the sealing and semiconductor element). Accordingly, once a defect occurs during formation of the wiring layers, it results in a waste of the semiconductor element sealed by resin. For this reason, there has been a problem that such a situation leads to a reduction in the fabrication yield in volume production.

SUMMARY

According to an aspect of the invention, there is provided a method of manufacturing a semiconductor element mounted wiring board, including: preparing a metal plate with an opening portion formed therein and then attaching the metal plate to a surface of a support base member; mounting a semiconductor element on the surface of the support base member in a face-up position, the surface of the support base member corresponding to the opening portion of the metal plate; forming an insulating layer so as to cover the metal plate and the semiconductor element on the support base member and thereby fabricating a semiconductor element sealed substrate; fabricating a wiring substrate by stacking wiring layers and insulating layers on a temporary substrate, and forming a conductive bump on the outermost wiring layer; stacking the semiconductor element sealed substrate and the wiring substrate on each other in such a way that an electrode terminal of the semiconductor element and the corresponding conductive bump on the outermost wiring layer face each other, and then connecting the electrode terminal to the conductive bump; and removing the support base member and the temporary substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preferred embodiments of the present invention will be explained with reference to the accompanying drawings.

First Embodiment

See FIGS. 1 to 6D

Figure 1:
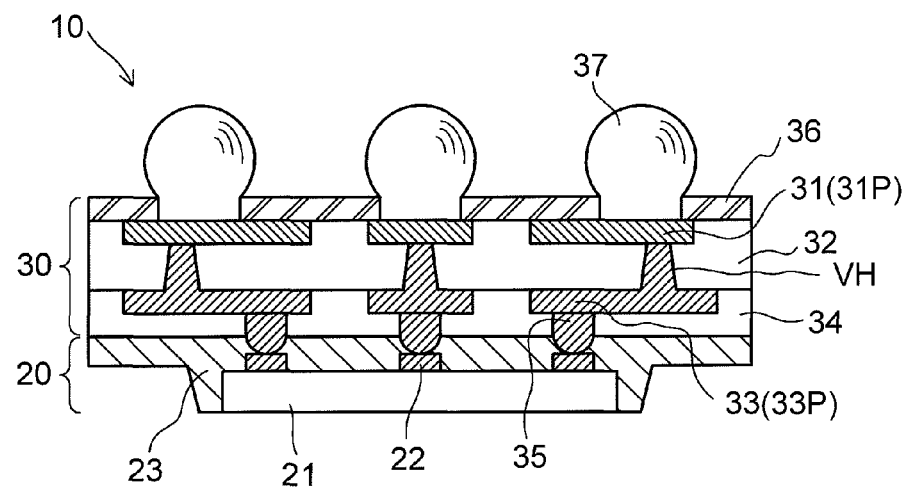
FIG. 1 is a cross-sectional view illustrating a configuration of a semiconductor element mounted wiring board (package) according to a first embodiment.

FIG. 1 illustrates a configuration of a semiconductor element mounted wiring board (package) according to a first embodiment, in a cross-sectional view.

Basically, a semiconductor element mounted wiring board (package) 10 according to the first embodiment has a structure in which a substrate 20 including a semiconductor element (chip) 21 sealed therein (hereinafter, referred to as a "chip sealed substrate") and a rewiring substrate 30 are connected to each other, the rewiring substrate 30 obtained by stacking a required number of wiring layers (rewiring layers) one on top of another with an insulating layer interposed therebetween. The chip 21 embedded in the chip sealed substrate 20 is a silicon chip (hereinafter, also referred to as a "die") obtained by dicing (separating) multiple devices fabricated onto a silicon wafer by using a later described process into device units.

In the chip sealed substrate 20, the chip 21 is sealed inside the substrate 20 in such a way that the rear surface of the chip 21 is exposed from a surface of the substrate 20, the rear surface being a surface opposite to another surface (pad formation surface) of the chip 21 where electrode pads (terminals) 22 of the chip 21 are formed. In addition, an insulating layer 23 is formed in the substrate 20 so as to seal the area around the pad formation surface and the side surfaces of the chip 21. This insulating layer 23 is formed so as to have a thin thickness at the portion around the chip (i.e., so as to be recessed from the rear surface of the chip 21) as illustrated.

Various forms of materials can be used for the material of the insulating layer 23. Examples of the material include a thermosetting epoxy-based resin, phenol resin, or the like used as molding resin, a liquid epoxy resin, or the like used as underfill resin, and a thermoplastic resin or the like. In addition, as a form of the resin, a film-type resin may be used as well instead of a liquid or paste resin.

Meanwhile, the rewiring substrate 30 has a structure so called a "coreless substrate." Unlike a general build-up multilayered wiring board obtained by alternately stacking wiring layers and insulating layers on both surfaces of a core substrate, the coreless substrate is a substrate obtained by alternately stacking wiring layers and insulating layers on a temporary substrate and then removing the temporary substrate to eventually leave only the wiring layers and the insulating layers (substrate having no core portion) as described later.

In this embodiment, the rewiring substrate 30 has a structure in which two wiring layers 31 and 33 and two insulating layers 32 and 34 are stacked. In this structure, the wiring layer 31, which is the lowermost wiring layer (positioned on the upper side in the illustrated example), functions as pads 31P for connecting external connection terminals (solder balls or the like) thereto. Further, the insulating layer 32 is formed on the wiring layer 31 so as to cover the wiring layer 31 (pads 31P). Then, the wiring layer 33 patterned in a required shape is formed on the insulating layer 32. The wiring layer 33 is formed on the insulating layer 32 so as to fill via holes VH formed in required positions of the insulating layer 32 and thereby to connect to the pads P31. The wiring layer 33 forms the outermost wiring layer of the rewiring substrate 30 in this embodiment.

Moreover, the insulating layer 34 is formed on the wiring layer 33 so as to cover the wiring layer 33. The insulating layer 34 is provided with opening portions formed in positions respectively corresponding to the positions of pads 33P each defined at a required position of the wiring layer 33. Conductive bumps 35 are formed on the pads 33P exposed through the opening portions, respectively. As illustrated, the conductive bumps 35 protrude from the surface of the rewiring substrate 30 and enter the inside of the insulating layer 23 of the chip sealed substrate 20. The conductive bumps 35 are thus connected to the electrode terminals 22 of the chip 21, respectively.

In other words, the wiring layer 33 (pads 33P) is provided so as to set the positions of the electrode terminals 22 of the chip 21 and the positions of the external connection pads 31P to be different from each other, which is so called "rewiring."

Typically, copper (Cu) is used as a material for the wiring layers (pads 31P and rewiring layer 33) and the conductive bumps 35, which form the rewiring substrate 30. However, the pads 31P are subjected to appropriate surface processing for increasing the contact properties of the pads 31P because external connection terminals (solder balls or the like) are bonded to the pads 31P, the external connection terminals being used in mounting this package 10 on a motherboard or the like as described later or in forming a POP structure with another package. In this embodiment, nickel (Ni) plating and gold (Au) plating are applied to the pads 31P in the order named. As a material for the insulating layers 32 and 34, a thermosetting epoxy-based resin, polyimide-based resin, or the like widely used as a build-up resin is used.

In addition, a solder resist layer 36 serving as a protection film is formed on the surface of the rewiring substrate 30, where the wiring layer 31 (pads 31P) are formed, so as to cover the surface of the rewiring substrate 30 while exposing the portions of the pads 31P from the surface thereof. Solder balls 37 serving as external connection terminals are bonded respectively onto the pads 31P exposed from the solder resist layer 36.

Here, the solder balls 37 (external connection terminals) are provided on the pads 31P in the example illustrated in FIG. 1, but the solder balls 37 are not necessarily provided. Basically, it is sufficient as long as the pads 31P are exposed so as to allow external connection terminals (such as solder balls or metal pins) to be bonded thereto when necessary.

Figure 2:
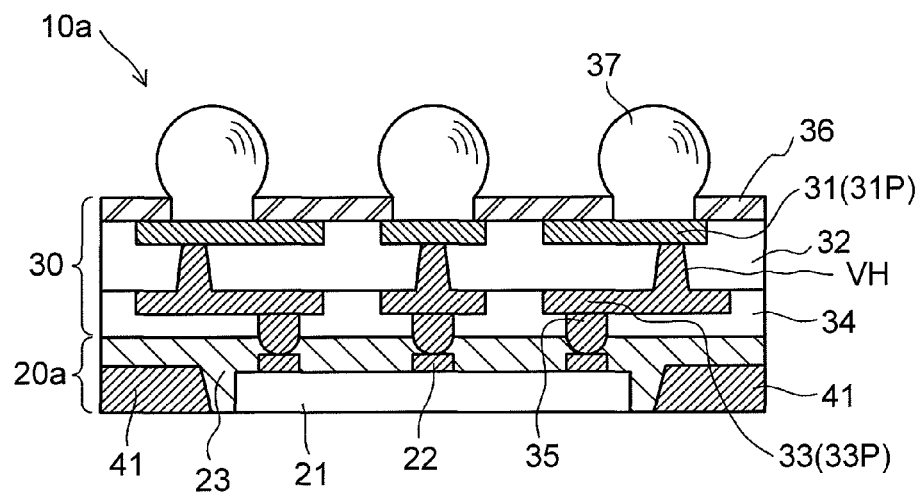
FIG. 2 is a cross-sectional view illustrating a configuration of a semiconductor element mounted wiring board (package) according to a modification of the embodiment illustrated in FIG. 1.

FIG. 2 illustrates a configuration of a semiconductor element mounted wiring board (package) according to a modification of the first embodiment illustrated in FIG. 1, in a cross-sectional view.

As compared with the configuration of the semiconductor element mounted wiring board 10 (FIG. 1) according to the aforementioned embodiment, a semiconductor element mounted wiring board (package) 10a according to this modification is different in that a metal plate (copper plate 41 in the embodiment) is added in a chip sealed substrate 20a. Specifically, in the chip sealed substrate 20a, the copper plate 41 is bonded to the portion of the insulating layer 23, where the insulating layer 23 has a thin thickness in the area around the chip, the insulating layer 23 being formed so as to seal the area around the pad formation surface and the side surfaces of the chip 21. Here, the copper plate 41 is bonded to the portion of the insulating layer 23 so as to be flush with the rear surface of the chip 21. The other portions of the configuration are the same as the configuration according to the aforementioned embodiment. Thus, the description of the other portions is omitted herein.

In the configuration of the package 10a according to this modification, the copper plate 41 arranged so as to surround the portion of the insulating layer 23 around the chip can serve as a reinforcement member. Specifically, as compared with the package 10 according to the aforementioned embodiment, the copper plate 41 can enhance the strength of the entire package 10a. Thus, such a configuration can effectively deal with a case where warpage or the like occurs.

Examples of the sizes of the components in the aforementioned packages 10 and 10a are described below. Firstly, the total thickness of the rewiring substrate and the solder resist layer 36 is selected to be approximately 100 to 400 µm. This thickness changes depending on the number of wiring layers to be stacked (two to six layers). In addition, the thickness of the chip 21 is selected to be approximately 100 µm (50 to 200 µm). Further, the height of each of the electrode terminals 22 is selected to be approximately 50 µm (30 to 100 µm). The thickness of the thin portion of the insulating layer 23 around the chip 21 is selected to be approximately 50 to 100 µm. The width of the portion of the insulating layer 23, which covers the side surfaces of the chip 21, is selected to be approximately 200 µm (100 to 300 µm). Further, the protruding height (height from the surface of the insulating layer 34) of each of the conductive bumps 35 is selected to be approximately 50 µm (30 to 100 µm).

Hereinafter, a description is given of a method of manufacturing the semiconductor element mounted wiring board (package) 10 according to the first embodiment with reference to FIGS. 3A to 6D illustrating examples of the manufacturing processes. Among the process diagrams, FIGS. 3A to 3D illustrate processes to fabricate a chip sealed substrate 20A (i.e., devices obtained by eventually dividing the chip sealed substrate 20A into individual device units correspond to the chip sealed substrates 20). Further, FIGS. 4A to 4E illustrate processes to fabricate a rewiring substrate 30A (i.e., devices obtained by eventually dividing the rewiring substrate 30A into individual device units correspond to the rewiring substrates 30).

To begin with, in the initial process (see FIG. 3A), in accordance with the size of a chip 21 to be sealed by resin, a metal plate 41 including opening portions OP each having a size sufficiently larger than the size of the chip 21 is prepared.

There are cases where the metal plate 41 is eventually removed as described later (case where the package 10 illustrated in FIG. 1 is manufactured) and where the metal plate 41 is eventually left as a portion of the product without being removed (case where the package 10a illustrated in FIG. 2 is manufactured). In the former case, the material for the metal plate 41 is not limited in particular, but in the latter case, a material having a sufficient mechanical strength and having a small coefficient of thermal expansion is preferably used as the material for the metal plate 41.

In this embodiment, the copper plate 41 is used in consideration of the availability, processibility and the like of the material. The thickness of the copper plate 41 to be used is selected to be approximately the same as the thickness of the chip 21, e.g., approximately 70 µm (50 to 100 µm). The opening portions OP having a required size are formed by press processing or etching processing in positions corresponding to portions of the copper plate 41 to be eventually divided as individual packages. During this process, the opening portions OP are each formed so as to have a trapezoidal shape in a cross section, i.e., a trapezoidal shape in which the upper opening portion thereof is larger than the lower opening portion thereof as illustrated.

In the next process (see FIG. 3B), the copper plate 41 is attached to a surface of a film shaped support base member (tape 42 made of a polyimide resin, polyester resin, or the like, for example), where an adhesive is applied, the film shaped support base member having one surface where the adhesive is applied. This tape 42 serves as a temporary member to hold (to temporarily fix), at a specified position, the chip 21 to be sealed by resin in a later process. In addition, the tape 42 is used as a member to prevent resin from leaking to the rear surface of the copper plate 41 when the chip 21 is sealed by resin in a later process.

In the next process (see FIG. 3C), the copper plate 41 is held by a holding fixture (not illustrated) while the surface of the copper plate 41 to which the tape 42 is attached faces downward. Then, silicon chips 21 which have been previously fabricated by a different process are mounted (die attached) on the portions of the tape 42, which correspond to the opening portions OP of the copper plate 41, respectively, while the surface of each of the silicon chips 21, where the electrode terminals 22 are formed, faces upward (face-up position).

The chips (dies) 21 each including the electrode terminals 22 formed on one of the surfaces thereof can be obtained in the following manner. Specifically, multiple devices are fabricated in an array onto a silicon wafer with a size of 12 inches, for example, by applying a required device process on one of the surfaces of the silicon wafer. Then, a passivation film made of silicon nitride (SiN), phosphorous silicate glass (PSG) or the like is formed on the surface of the silicon wafer where the devices are formed. Then, post terminals (protruding terminals 22) are formed on the electrode pads by sputtering, plating or the like after removal of portions of the passivation film by laser or the like, the portions corresponding to the electrode pads each defined at a portion of an aluminum wiring layer formed in a required pattern on each of the devices. Further, the wafer is ground to have a predetermined thin thickness (thickness approximately the same as the thickness of the copper plate 41), and thereafter, the wafer is diced into device units by a dicer or the like.

When the wafer is divided into the individual device units, the wafer is mounted on a dicing tape supported by a dicing frame with a die attach film interposed between the wafer and the dicing tape, while a surface of the wafer, which is opposite to the surface where the devices are fabricated, is attached to the die attach film. Then, the wafer is cut by the blade of the dicer along a line defining the regions of devices. Thereafter, the chips 21 obtained by cutting and dividing the wafer into the device units are picked up. At this time, the die attach film is still attached to the individual chips 21 (not illustrated). Thus, the chips 21 can be temporarily fixed onto the tape 42 by adhesion of the die attach film.

Note that, when the chips 21 are mounted at the specified positions on the tape 42, positioning holes (or marks) are previously provided in predetermined positions of the copper plate 41. Then, the positioning holes are read by use of a microscope or the like, and then the chips 21 are mounted on.

Further, although the active surface (pad formation surface) of each of the chips 21 in accordance with the detected positions of the chips 21 is located at a position recessed from the surface of the copper plate 41 in the illustrated example, the active surface (pad formation surface) of the chip 21 may be located at a position protruding from the surface of the copper plate 41, or may be flush with the surface of the copper plate 41.

In the next process (see FIG. 3D), the insulating layer 23 is formed on the surface of the tape 42, where the copper plate 41 and the chips 21 are mounted, so as to cover the copper plate 41 and the chips 21 (including the portions of the electrode terminals 21). For example, a resin layer (insulating layer 23) is formed by lamination of a resin film made of a thermosetting epoxy-based resin, polyimide-based resin, phenol resin, or the like widely used as a build-up resin and then used to seal the area around the pad formation surface and the side surfaces of each of the chips 21. Note that, in a case where a thermosetting resin is used, the resin layer (insulating layer 23) is not fully cured at this stage and is kept in a semi-cured state.

As a material for the insulating layer 23 to be formed in this process, various forms of materials can be used without being limited to the thermosetting resin. For example, a thermoplastic resin, a photosensitive resin, or the like may be used. In addition, a liquid resin or paste resin may be used as well. Specifically, the insulating layer 23 may be formed by lamination of a film adhesive such as an anisotropic conductive film (ACF) or a non-conductive film (NCF) or by application of an adhesive such as anisotropic conductive paste (ACP) or non-conductive paste (NCP) by use of a printing method.

Through the aforementioned processes, the chip sealed substrates 20A are thus fabricated.

In the next process (see FIG. 4A), a temporary substrate 50 serving as a base member for fabricating the rewiring substrates 30A is prepared. As a material for the temporary substrate 50, a metal soluble in an etching solution (such as copper (Cu)) is used considering that the temporary substrate 50 is eventually subjected to etching as described later. In addition, as a form of the temporary substrate 50, a metal plate or metal foil is basically sufficient.

Figure 4A:
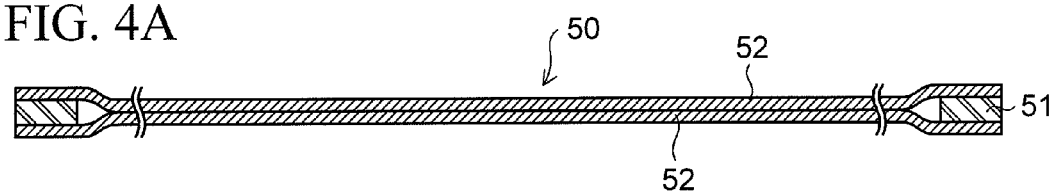
FIGS. 4A to 4E are cross-sectional views illustrating manufacturing processes subsequent to the manufacturing processes illustrated in FIGS. 3A to 3D.
Figure 4B:
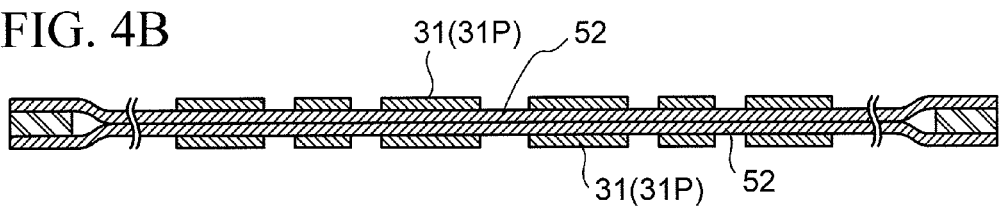

Specifically, a material in the form disclosed in "Method of Manufacturing Wiring Board and Method of Manufacturing Electronic Component Mounted Structure" (Japanese Laid-open Patent Publication No. 2007-158174) previously proposed by the applicant of the present application can be used. Specifically, a structure obtained by arranging copper foils 52 on both surfaces of a prepreg 51 (e.g., a bonding sheet in a semi-cured B stage, formed by impregnating a thermosetting resin such as an epoxy-based resin into glass cloth that is a reinforcement material) and then applying heat and pressure to the prepreg can be preferably used as the temporary substrate 50. In this case, the prepreg 51 is provided in a rectangular ring shape when viewed in a plan view. Accordingly, as illustrated in FIG. 4A, the two copper foils 52 are directly attached to each other in the inner portion of the ring.

In the next process (see FIG. 4B), wiring layers 31 each patterned in a required shape are formed on both surfaces of the temporary substrate 50 (on the respective copper foils 52). A specific example of the process is described below.

First, a plating resist is formed by use of a patterning material on both surfaces of the temporary substrate 50, i.e., on the respective copper foils 52, and then is patterned in a required shape to form resist layers. Each resist layer is patterned and formed to have opening portions corresponding to the shape of a corresponding one of the wiring layers 31 (pads 31P) to be formed.

As the patterning material, a photosensitive dry film (structure obtained by holding a resist material between a polyester cover sheet and a polyethylene separator sheet) or a liquid photoresist (liquid resist such as a novolac-based resin or epoxy-based resin) can be used. For example, when a dry film is used, on both surfaces of the temporary substrate 50 (on the respective copper foils 52) are cleansed first, and dry films are laminated thereon by thermal pressure bonding. Then, each of the dry films is cured by exposure to ultraviolet (UV) irradiation with a mask patterned in a required shape. Further, the cured portions are etched away by using a predetermined developer to form a required resist layer. Even in a case where a liquid photoresist is used, the plating resist (resist layer) can be formed through the same process.

Next, the wiring layers 31 (pads 31P) corresponding to the opening portions are formed by electrolytic plating using the copper foils 52 as a power feeding layer, on the copper foils 52 exposed through the opening portions of the plating resists.

A metal species insoluble in the etching solution is selected as a material for forming the wiring layers 31 (pads 31P), considering that the copper foils 52 in contact with the material are eventually subjected to etching. In this embodiment, as a metal different from the material of the copper foils 52, gold (Au) plating is applied on the copper foils 52 considering that gold plating achieves a good conductivity. Further, nickel (Ni) plating is applied on the Au plating layer, and then, copper (Cu) plating is applied on the Ni plating layer. The reason for employing such a plating structure is to enhance the adhesion of the pads 31P when solder balls or the like are eventually connected thereto and also to prevent Cu from diffusing into the Au plated layer. In other words, the pads 31P each formed of a three-layer structure including Au/Ni/Cu layers are formed.

Although the three-layer structure including Au/Ni/Cu layers are formed in this process, each of the pads 31P may be formed of a four-layer structure including Au/Pd/Ni/Cu layers obtained by application of palladium (Pd) plating after the application of Au plating but before the application of Ni plating.

Further, the resist layers used as the plating resists are removed. For example, an alkaline chemical liquid such as sodium hydroxide or a monoethanolamine solution can be used for removal in a case where a dry film is used as the plating resists. In addition, acetone, alcohol, or the like can be used for removal in a case where a liquid resist is used. Accordingly, a structure in which the pads P31 are formed on both surfaces of the temporary substrate 50 (on the respective copper foils 52) as illustrated is completed.

In the next process (see FIG. 4C), the insulating layers 32 covering the wiring layers 31 are formed on both surfaces of the temporary substrate 50 (on the copper foils 52), respectively, and opening portions VH are formed in predetermined positions of each of the insulating layers 32 (positions corresponding to the portions of the pads 31P).

As a material for the insulating layers 32, an epoxy-based resin, polyimide-based resin, or the like can be used. As a formation method, epoxy-based resin films are laminated on both surfaces of the temporary substrate 50, i.e., on the respective copper foils 52, for example. Then, the resin films are cured by a heating process at a temperature of 130 to 150° C. while being pressed. In this manner, the resin layers (insulating layers 32) can be formed. Further, via holes (opening portions) VH extending to the respective pads 31P are formed in required positions of each of the insulating layers 32 by a drilling process using a carbon dioxide or excimer laser.

In this process, the via holes (opening portions) VH are formed by using a laser or the like, but photolithography can be used as well to form required opening portions in a case where the insulating layers 32 are formed by using a photosensitive resin. In this case, a photosensitive epoxy resin is applied onto both surfaces of the temporary substrate 50 (on the copper foils 52) first. Then, after pre-bake processing of the epoxy resin, the resin layers are subjected to exposure and development by use of a mask (patterning of the resist layers). Then, the resin layers are subjected to post-bake processing. Thus, the resin layers (insulating layers 32) each having opening portions VH in required positions as illustrated are formed. During this process, the patterning of the resin layers is performed in accordance with the shape (arrangement) of the pads 31P formed on the copper foils 52. Accordingly, when the resin layers are subjected to the exposure and development, the portions of the resin layers corresponding to the pads 31P are removed. Thus, the via holes (opening portions) VH extending to the respective pads 31P are formed.

In the next process (see FIG. 4D), the wiring layers (rewiring layers) 33 of a required shape to fill the via holes VH and thus to be connected to the pads 31P are formed on the respective insulating layers 32 on both surfaces of the temporary substrate 50 by a semi-additive method or the like. A specific example of this process is described below.

First, a seed layer is formed on each of the insulating layers 32 by sputtering, electroless plating, or the like. For example, a seed layer having a two-layer structure can be formed by depositing chromium (Cr) or titanium (Ti) (adhesive metal layer: Cr layer or Ti layer) by sputtering, and by further depositing copper (Cu) thereon by sputtering. Next, a plating resist is formed on the seed layer by use of a patterning material. Then, the plating resist is patterned in a required shape to form a resist layer. This resist layer is patterned in accordance with the pattern shape of the wiring layer 33 to be formed. This patterning process can be performed in the same manner as the processing performed in the process of FIG. 4B.

Next, the wiring layer (rewiring layer) 33 made of Cu is formed in a required shape by electrolytic Cu plating using the seed layer as a power feeding layer, while the patterned resist layer is used as a mask. Thereafter, the resist layer is removed in the same manner as in the processing performed in the process of FIG. 4B.

Further, the exposed seed layer is removed by wet etching. In this case, the Cu layer in the upper layer portion of the seed layer is removed first by an etching solution that dissolves Cu. Next, the adhesive metal layer (Cr layer or Ti layer) in the lower layer portion of the seed layer is removed by an etching solution that dissolves Cr or Ti. Thus, the insulating layer 32 is exposed as illustrated. Thereafter, predetermined surface cleansing or the like is performed.

Note that the wiring layer 33 formed in this process forms the outermost wiring layer of the rewiring substrate 30 in this embodiment. However, the wiring layers and insulating layers may be alternately stacked until a required number of layers are formed by repeating the same processing as the processing performed in the processes of FIGS. 4C and 4D, as appropriate.

Figure 4C:
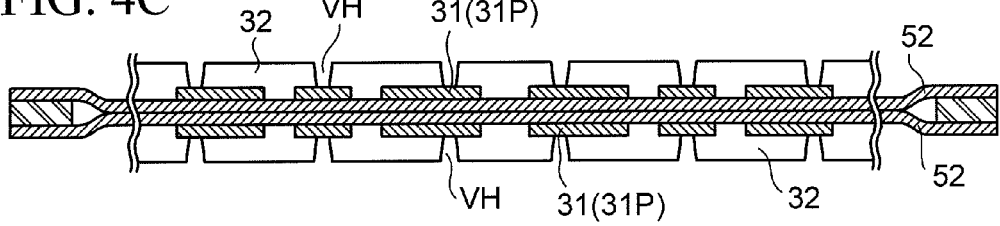
Figure 4D:
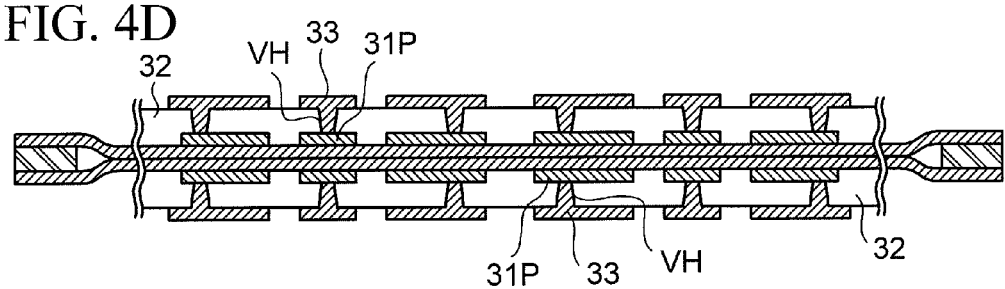
Figure 4E:
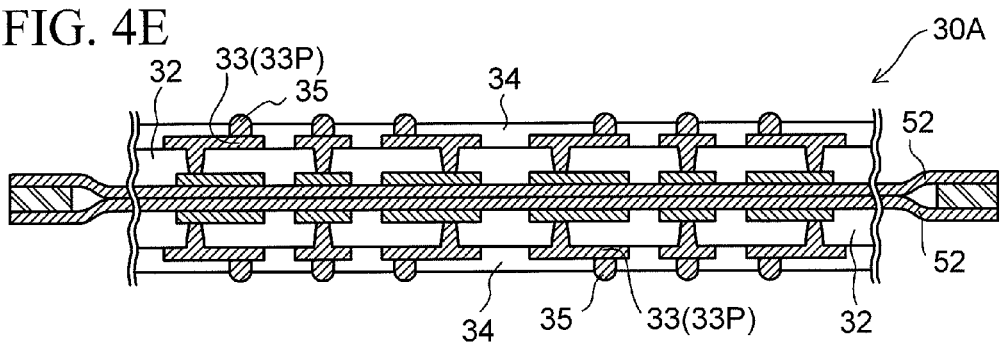

In the next process (see FIG. 4E), the insulating layers 34 are formed respectively on the insulating layers 32 and the wiring layers 33 on both surfaces of the temporary substrate 50 in the same manner as the processing performed in the process of FIG. 4C. Then, opening portions are formed in predetermined positions of each of the insulating layers 34 (positions corresponding to the portions of the pads 33P of each of the wiring layers 33). Further, the conductive bumps 35 to be connected respectively to the pads 33P exposed through the opening portions are formed. Electrolytic Cu plating or the like can be used to form the required bumps 35, for example.

Thus, the structure (rewiring substrate 30A) is completed, in which a required number of rewiring layers (single rewiring layer 33 in the illustrated example) are formed on both surfaces of the temporary substrate 50 (on the copper foils 52), and a required number of bumps 35 are formed on each of the outermost wiring layers 33.

In the next process (see FIG. 5A), the structures (chip sealed substrates 20A) fabricated through the processes of FIGS. 3A to 3D are placed respectively on both surfaces of the structure (rewiring substrate 30A) fabricated through the processes of FIGS. 4A to 4E. Here, the structures (chip sealed substrates 20A) are placed respectively on both surfaces of the structure (rewiring substrate 30A) in such a way that the positions of the electrode terminals 22 of the chip 21 of each of the chip sealed substrates 20A match the positions of the corresponding bumps 35 on a corresponding one of the surfaces of the rewiring substrate 30A. Then, the surfaces of the substrates 20A and the surfaces of the substrate 30A, which face each other, are overlapped with each other via the insulating layers 23 (resin sealing the chips 21: the resin is in a semi-cured state when a thermosetting resin is used) and the insulating layers 34 of the rewiring substrate 30A. Then, the substrates 20A and 30A are heated and pressurized by thermal pressure bonding in vacuo at a temperature of approximately 200° C., and the insulating layers 23 are completely cured so as to adhere to the insulating layers 34 of the rewiring substrate 30A (to connect the substrates 20A and the substrate 30A). During this process, the substrates 20A are stacked on the substrate 30A while the leading ends of the conductive bumps 35 are respectively pressed against the edge surfaces of the electrode terminals 22 to connect the bumps 35 and the electrode terminals 22.

Accordingly, the substrates 20A and the substrate 30A are integrated (mechanically bonded to each other) into a single structure via the cured resin layers (insulating layers 23) while being electrically connected to each other via the electrode terminals 22 of the chips 21 and the corresponding bumps 35.

In the next process (see FIG. 5B), the ring shaped prepreg 51 forming a portion of the temporary substrate 50 (FIG. 4A) is cut along the inner periphery thereof. Thus, the two copper foils 52 forming a portion of the temporary substrate 50 are separated from each other as illustrated in FIG. 5B to form two divided structures. In each of the structures obtained by dividing the structure into the upper and lower portions, the copper foil 52 remains on one of the surfaces of the structure, and the tape 42 remains on the other surface thereof.

In the next process (see FIG. 6A), from each of the structures fabricated in the process of FIG. 5B, the tape 42 used as the temporary support base member to hold the chips 21 is peeled off, and the copper foil 52 used as the base member for fabricating the rewiring substrate 30A is removed by etching.

Thus, the structures are obtained, in each of which the surfaces of the pads 31P are exposed to be flush with the surface of the insulating layer 32 and the rear surfaces (surfaces opposite to the surfaces where the electrode terminals 22 are formed) of the chips 21 and the exposed surfaces of the copper plates 41 are flush with the surface of the insulating layer 23 as illustrated.

In the next process (see FIG. 6B), the solder resist layer (insulating layer) 36 is formed on the surface of the structure, where the wiring layer 31 (pads 31P) is formed, so as to cover the surface (the wiring layer 31 and the insulating layer 32) thereof while exposing the portions of the pads 31P from the surface. This solder resist layer 36 can be formed by laminating a solder resist film or applying a liquid solder resist on the surface, and then patterning the resist in a required shape, for example.

Each of the pads 31P exposed from the solder resist layer 36 has a three-layer structure including Cu/Ni/Au in the order named from the lower surface thereof. Thus, the Au layer is exposed on the surface of the structure (see the process of FIG. 4B).

In the next process (see FIG. 6C), the copper plate 41 (FIG. 6B) is selectively removed with respect to the chips 21, the insulating layer 23, the pads 31P, and the solder resist layer 36. For example, wet etching using an aqueous ferric chloride solution, copper chloride solution, or the like can be used to selectively remove the copper plate 41 with respect to the chips 21 (silicon), the insulating layer 23 (epoxy-based resin or the like), the pads 31P (Au layer is formed on the surface layer portion thereof), and the solder resist layer 36.

In the final process (see FIG. 6D), flux is appropriately applied onto the pads 31P exposed from the solder resist layer 36 (FIG. 6C), and thereafter, solder balls 37 used as the external connection terminals are placed thereon. Then, the solder balls 37 are fixed by a reflow process at a temperature approximately between 240 and 260° C. Further, the surface of the structure is cleansed to remove the flux. Subsequently, the structure is divided into individual device units (units corresponding to portions each including the chip 21, the bumps 35 electrically connected to the electrode terminals 22 of the chip 21, and the wiring layers 33 and 31) by using a dicer or the like.

In this process, the dicing is performed after the solder balls 37 are bonded to the pads, but this order may be reversed, i.e., the solder balls 37 may be bonded to the pads of each of the individual devices after the dicing is performed. In addition, although the solder balls 37 (external connection terminals) are provided in the illustrated example, the solder balls 37 do not necessarily have to be provided. In this case, the pads 31P may be left exposed so as to allow external connection terminals to be bonded thereto when necessary as described above.

Through the aforementioned processes, the semiconductor element mounted wiring board 10 (FIG. 1) of this embodiment is thus fabricated.

Figure 6A:
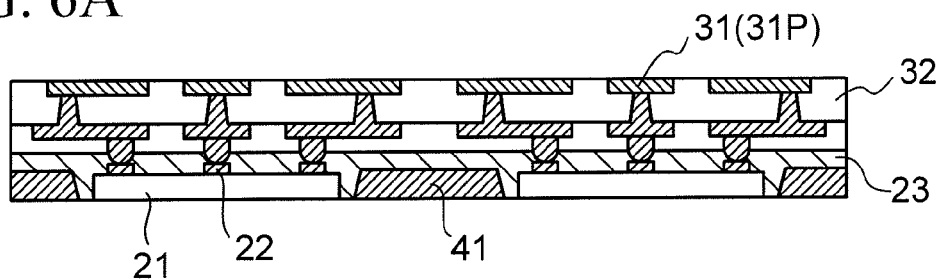
FIGS. 6A to 6D are cross-sectional views illustrating manufacturing processes subsequent to the manufacturing processes illustrated in FIGS. 5A and 5B.
Figure 6B:
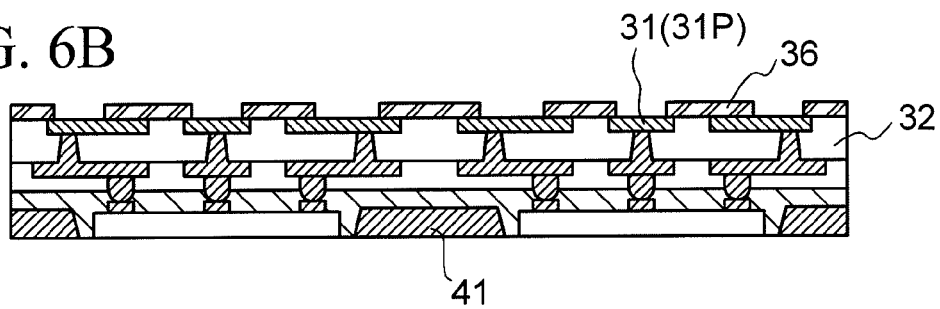
Figure 6C:
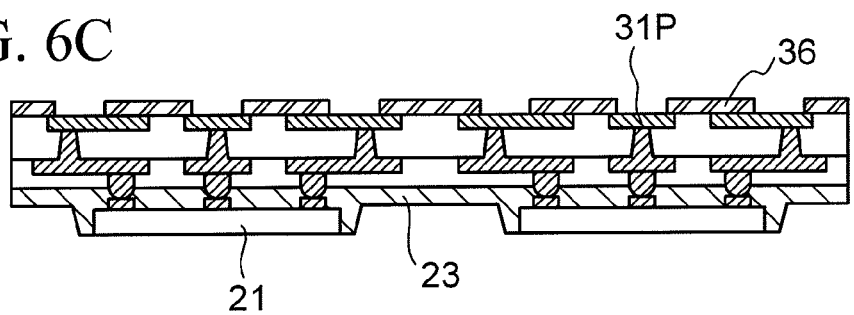
Figure 6D:
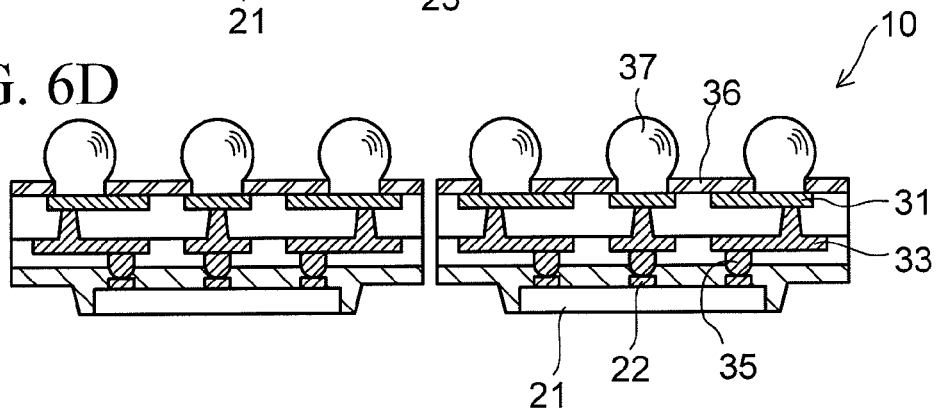

Note that, the semiconductor element mounted wiring board 10a according to the modification illustrated in FIG. 2 can be fabricated by omitting the process of FIG. 6C from the aforementioned processes.

As described above, according to the semiconductor element mounted wiring board 10 (10a) according to this embodiment and the method of manufacturing the same (FIGS. 3A to 6D), the chip sealed substrates 20 (20a) and the rewiring substrates 30 are fabricated by using the separate processes. Thus, even when a defect occurs in a substrate during the formation of rewiring layers, without using the rewiring substrate 30 in which the defect occurs, only a good substrate (rewiring substrate 30) having no defect can be used for connection with the chips 21 (good chip sealed substrates 20 and 20a).

Accordingly, the waste of a resin sealed semiconductor element (chip) as observed in the conventional art can be eliminated, and the fabrication yield can be thus improved. The method of manufacturing the semiconductor element mounted wiring board 10 (10a) according to this embodiment is a very effective method for volume production.

Second Embodiment

Figure 7A:
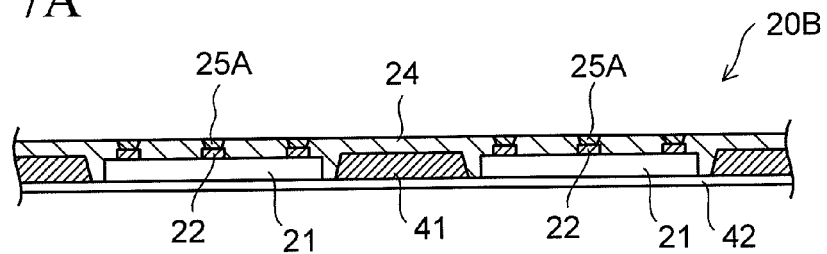
FIGS. 7A to 7C are cross-sectional views illustrating (partial) manufacturing processes of a semiconductor element mounted wiring board (package) according to a second embodiment.
Figure 7B:
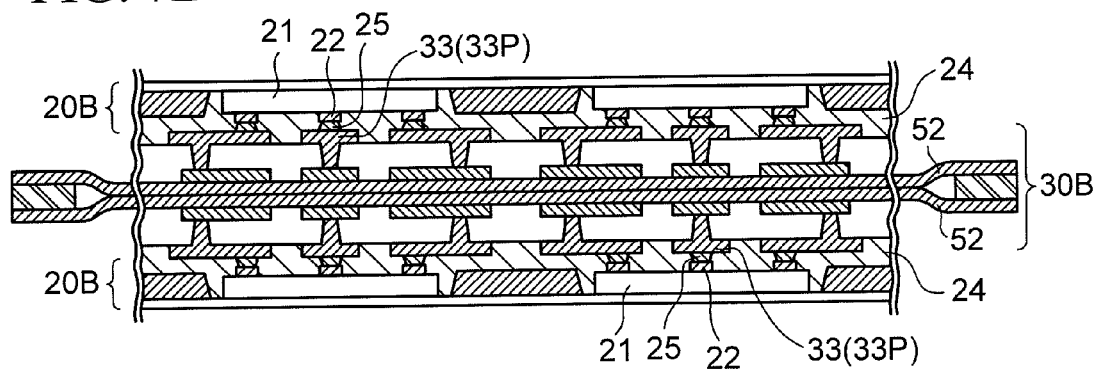
Figure 7C:
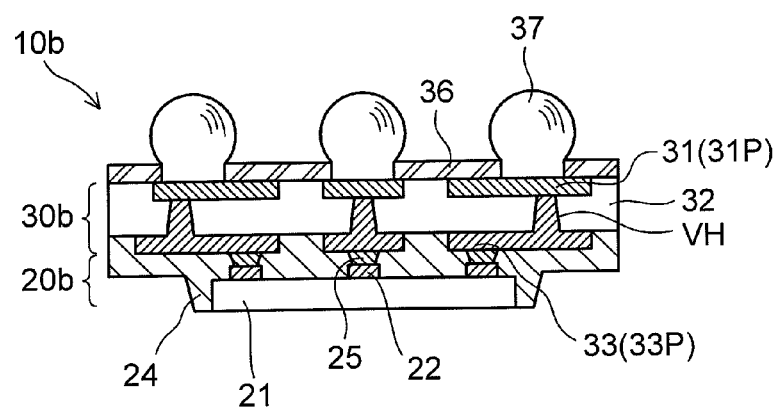
Figure 8A:
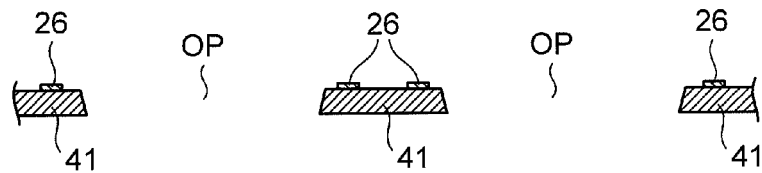
FIGS. 8A to 8D are cross-sectional views illustrating (partial) manufacturing processes of a semiconductor element mounted wiring board (package) according to a third embodiment.
Figure 8B:
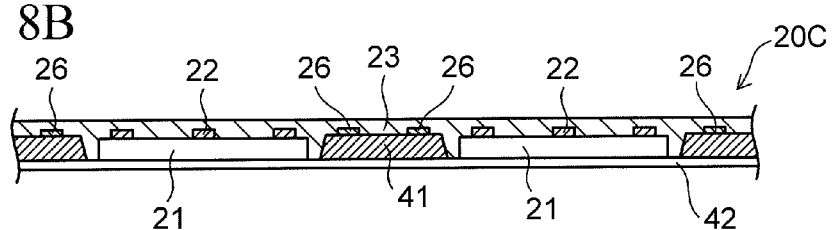
Figure 8C:
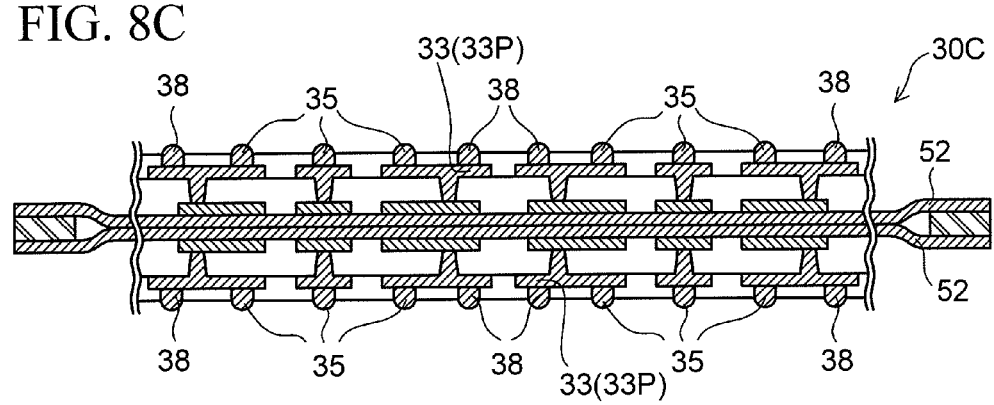
Figure 8D:
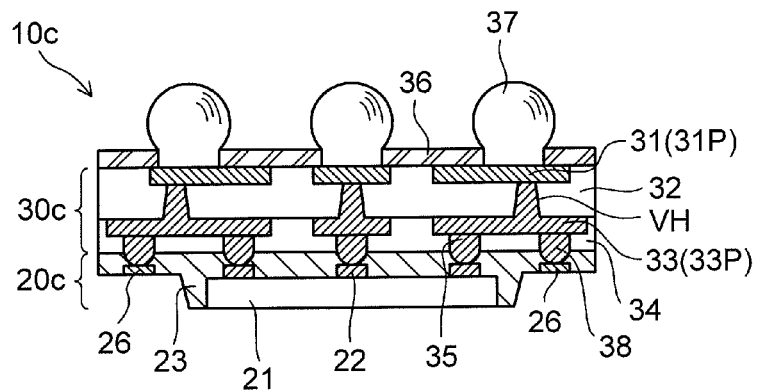

See FIGS. 7A to 7C

FIGS. 7A to 7C illustrate (partial) manufacturing processes of a semiconductor element mounted wiring board (package) according to a second embodiment, in a cross sectional view.

As compared with the configuration of the semiconductor element mounted wiring board 10 (FIG. 1) according to the aforementioned first embodiment, a semiconductor element mounted wiring board 10b (FIG. 7C) according to the second embodiment is different in that conductive vias 25 connected to the electrode terminals 22 of each of the chips 21 are formed in a chip sealed substrate 20b, and also in that the electrode terminals 22 of each of the chips 21 are connected to the portions of the pads 33P of the outermost wiring layer 33 of a rewiring substrate 30b via the conducive vias 25, respectively. The other portions of the configuration of the semiconductor element mounted wiring board 10b are the same as those in the case of the first embodiment. Thus, the description of the other portions is omitted herein.

The package (semiconductor element mounted wiring board) 10b according to the second embodiment can be basically fabricated by using the same processing performed in the manufacturing processes (FIGS. 3A to 6D) according to the first embodiment. However, the processing to form the portion relating to the differences between the aforementioned configurations is different. Hereinafter, the processing relating to the different portion is particularly described.

Figure 3A:
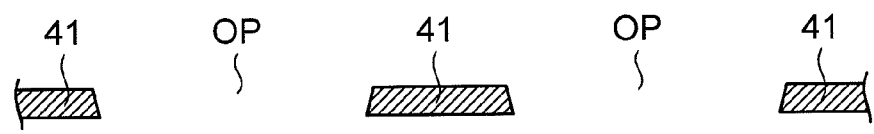
FIGS. 3A to 3D are cross-sectional views illustrating exemplary manufacturing processes of the semiconductor element mounted wiring board (package) illustrated in FIG. 1.
Figure 3B:
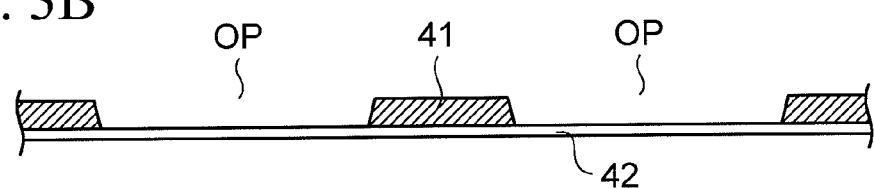
Figure 3C:
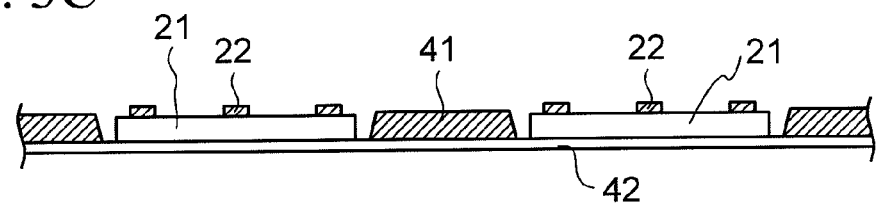
Figure 3D:
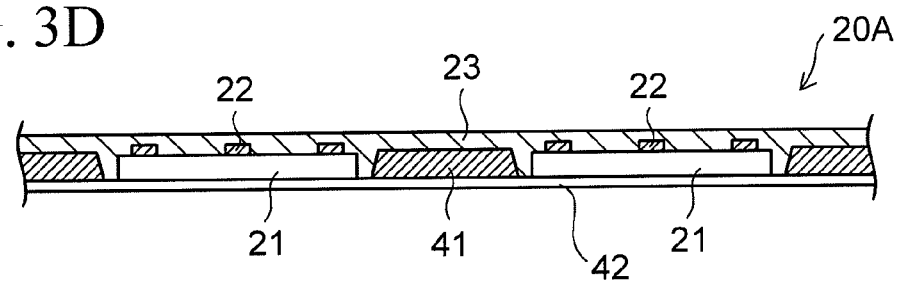

First, after the same processing as the processing performed in the processes of FIGS. 3A to 3C is performed, a resin layer (insulating layer 24) is formed on the surface of the structure, where the copper plate 41 and the chips 21 are placed on the tape 42, so as to cover the copper plate 41 and the chips 21 (including the portions of the electrode terminals 22) (see FIG. 7A) in the same manner as the processing performed in the process of FIG. 3D. Here, the resin layer (insulating layer 24) is cured in this stage. As a form of the resin used as the insulating layer 24, a thermoplastic resin is preferably used considering that the resin is used for thermal compression bonding in vacuo to a rewiring substrate 30B after the resin is cured in this stage. For example, a thermoplastic epoxy resin, polyimide resin, or the like is used.

Further, via holes respectively extending to the electrode terminals 22 are formed in predetermined positions (positions corresponding to the portions of the electrode terminals 22 of each of the chips 21) of the insulating layer 24 (thermoplastic epoxy resin or the like). Then, conductive paste (e.g., conductive paste containing silver (Ag) or copper (Cu) filler) is filled in the via holes by a screen printing method, a dispenser, or the like to form the conductive vias 25A. The lower ends of the conductive vias 25A are bonded to the rewiring layer (pads 33P) during the stacking process to be performed in a later process. Thus, the conductive vias 25 and the rewiring layer (pads 33P) are connected to each other. Note that, as another form of the conductive paste, it is possible to use solder paste. In this case, the solder paste (conductive vias 25A) melts once during the stacking process, and the conductive vias 25 and the rewiring layer (pads 33P) are thereby connected to each other.

In addition, in a case where the conductive vias 25A are formed during this process by use of conductive paste formed of a thermosetting epoxy resin or the like containing Ag or Cu filler, the conductive vias 25A may be set in semi-cured state first, and then, the conductive vias 25 and the rewiring layer (pads 33P) may be connected to each other by causing the conducive vias 25A to be completely cured while the lower ends of the conductive vias 25A are brought into contact with the rewiring layer (pads 33P) during the stacking process to be performed in a later process.

Next, the same processing as the processing performed in the processes of FIGS. 4A to 4D is performed. Thus, a structure (rewiring substrate 30B) is formed, in which a required number of rewiring layers (single rewiring layer 33 in the illustrated example) are formed on both surfaces of the temporary substrate (on the copper foils 52), and the outermost wiring layers 33 are exposed from the respective surfaces of the structure.

Figure 5A:
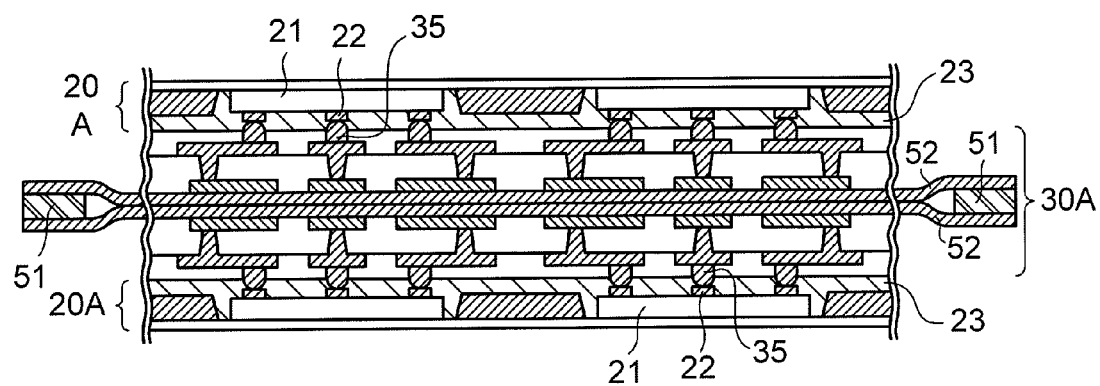
FIGS. 5A and 5B are cross-sectional views illustrating manufacturing processes subsequent to the manufacturing processes illustrated in FIGS. 4A to 4E.
Figure 5B:
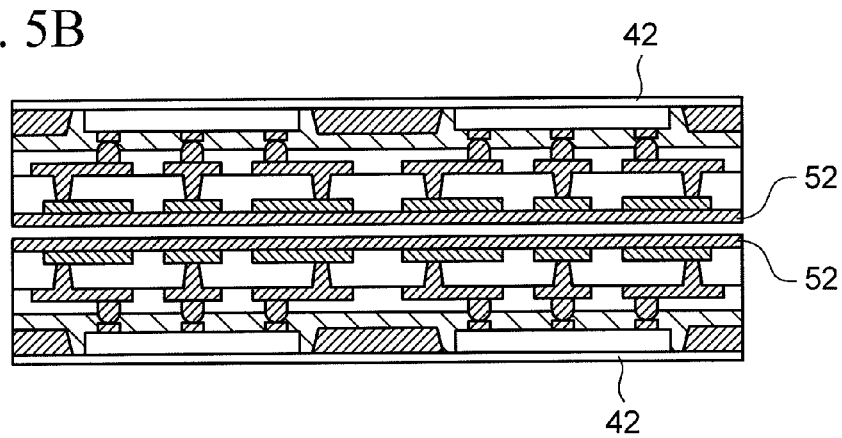

Further, chip sealed substrates 20B fabricated in the process of FIG. 7A are placed respectively on both surfaces of the rewiring substrate 30B in the same manner as the processing performed in the process of FIG. 5A. Here, the chip sealed substrates 20B are placed respectively on both surfaces of the rewiring substrate 30B in such a way that the positions of the conductive vias 25 provided on the electrode terminals 22 of each of the chips 21 of each of the chip sealed substrates 20B match the positions of the corresponding pads 33P on a corresponding one of the surfaces of the rewiring substrate 30B. Then, the surfaces of the substrates 20B and the surfaces of the substrate 30B, which face each other, are overlapped with each other via the insulating layers 24 (resin sealing the chips 21) and the insulating layers 32 of the rewiring substrate 30B. Then, the substrates 20B and 30B are heated and pressurized by thermal pressure bonding in vacuo at a temperature of approximately 200° C. to bond the insulating layers 24 to the insulating layers 32 of the rewiring substrate 30B (to connect the substrates 20B and the substrate 30B).

The processing to be performed thereafter is the same as the processing performed in the processes of FIGS. 5B to 6D. Through the aforementioned processes, the semiconductor element mounted wiring board 10b (FIG. 7C) according to the second embodiment is thus fabricated.

According to the second embodiment, in addition to the effects obtained in the aforementioned first embodiment, the following advantages can be further obtained. Specifically, the conductive vias 25 provided on the electrode terminals 22 of each of the chips 21 in the chip sealed substrate 20b are directly connected to the pads 33P of the outermost layer 33 of the rewiring substrate 30b. Accordingly, no build-up layer corresponding to the insulating layer 34 covering the periphery of each of the bumps 35 (see FIG. 1A) in the first embodiment has to be provided. Thus, the entire package 10b can be made thinner.

Third Embodiment

See FIGS. 8A to 8D

FIGS. 8A to 8D illustrate (partial) manufacturing processes of a semiconductor element mounted wiring board (package) according to a third embodiment, in a cross sectional view.

As compared with the configuration of the semiconductor element mounted wiring board 10 (FIG. 1) according to the aforementioned first embodiment, a semiconductor element mounted wiring board 10c (FIG. 8D) according to the third embodiment is different in that pads 26 for external connection are provided in a thin thickness portion of the insulating layer 23 formed around the chip so as to seal the chips 21 in a chip sealed substrate 20C (in this embodiment, Au plating and Ni plating are applied to the exposed surface of the insulating layer 23 in the order named to form the pads 26 (Au/Ni plated layer)). In addition, the semiconductor element mounted wiring board 10c according to the third embodiment is different in that conducive bumps 38 are formed at predetermined positions of the outermost wiring layer 33 of the rewiring substrate 30c (at the portions of the pads 33P corresponding to the positions of the pads 26 in the chip sealed substrate 20c). An Au/Ni/Cu or Au/Pd/Ni/Cu layer structure or the like may be used as the layer structure of the pads 26 instead of the Au/Ni layer structure. The other portions of the configuration of the semiconductor element mounted wiring board 10c are the same as those in the case of the first embodiment. Thus, the description of the other portions is omitted herein.

The package (semiconductor element mounted wiring board) 10c according to the third embodiment can be basically fabricated by using the same processing performed in the manufacturing processes (FIGS. 3A to 6D) according to the first embodiment. However, the processing to form the portion relating to the differences between the aforementioned configurations is different. Hereinafter, the processing relating to the different portions is particularly described.

First, in the initial process (see FIG. 8A), a copper plate 41 having opening portions OP provided in required positions thereof are prepared in the same manner as the processing performed in the process of FIG. 3A, and thereafter, Au plating and Ni plating are applied to predetermined positions on the copper plate 41 in the order named to form the pads 26.

Then, after the same processing as the processing performed in the processes of FIGS. 3B and 3C is performed, a resin layer (insulating layer 23) is formed on a surface of the structure, where the copper plate 41 and the chips 21 are placed on the tape 42, so as to cover the copper plate 41 and the chips 21 (including the portions of the electrode terminals 22) (see FIG. 8B) in the same manner as the processing performed in the process of FIG. 3D. Specifically, chip sealed substrates 20C are fabricated.

Next, after the same processing as the processing performed in the processes of FIGS. 4A to 4D is performed, a required number of rewiring layers (single rewiring layer 33 in the illustrated example) are formed on both surfaces of the temporary substrate (on the copper foils 52). Then, a rewiring substrate 30C in which a required number of bumps 35 and 38 are formed at predetermined positions of each of the outermost wiring layers 33 is formed (see FIG. 8C) in the same manner as the processing performed in the process of FIG. 4E.

The processing to be performed thereafter is the same as the processing performed in the processes of FIGS. 5A to 6D. Through the aforementioned processes, the semiconductor element mounted wiring board 10c (FIG. 8D) according to the third embodiment is thus fabricated.

According to the third embodiment, in addition to the effects obtained in the aforementioned first embodiment, the following advantages can be further obtained. Specifically, the pads 26 (Au/Ni plated layer) are formed at the portions of the insulating layer 23 around the chips 21 through the surface processing for solder attachment. Thus, a POP structure (three dimensional mounting structure) can be easily achieved. For example, a two-level structure POP bonding can be achieved by attaching an appropriate amount of solder onto the pads 26, then, causing external connection terminals (solder balls) of another package (like the semiconductor element mounted wiring boards 10, 10a, and 10b illustrated in FIGS. 1, 2 and 7C) to come in contact with the solder, and thereafter melting and curing the solder by a reflow process.

Further, when the semiconductor element mounted wiring board 10c according to the third embodiment is used as another package for POP bonding, a POP structure having three levels or more can be easily achieved. This advantage contributes to a further increase in performance (functionality) as the semiconductor device.

In addition, without limiting to the aforementioned POP (package-on-package) structure, various electronic components (passive components such as a chip capacitor and a resistance, and the like) can be mounted on the semiconductor element mounted wiring board 10c according to the third embodiment.

In the aforementioned embodiments, the examples of a case where a single semiconductor element (chip) is mounted on the package are described. However, as it is apparent from the gist of the invention (to fabricate semiconductor element sealed substrates and wiring substrates by separate processes, and then to connect only good substrates to each other eventually to form an integrated structure), the number of semiconductor elements to be mounted on the package is not limited to one as a matter of course. Depending on the functions or the like required as a semiconductor device, a package structure including two or more semiconductor elements (chips) embedded therein may be formed as appropriate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor element mounted wiring board, comprising:
    preparing a metal plate with an opening portion formed therein and then attaching the metal plate to a surface of a support base member;
    mounting a semiconductor element on the surface of the support base member in a face-up position, the surface of the support base member corresponding to the opening portion of the metal plate;
    forming an insulating layer so as to cover the metal plate and the semiconductor element on the support base member and thereby fabricating a semiconductor element sealed substrate;
    fabricating a wiring substrate by stacking wiring layers and insulating layers on a temporary substrate, and forming a conductive bump on the outermost wiring layer;
    stacking the semiconductor element sealed substrate and the wiring substrate on each other in such a way that an electrode terminal of the semiconductor element and the corresponding conductive bump on the outermost wiring layer face each other, and then connecting the electrode terminal to the conductive bump; and
    removing the support base member and the temporary substrate.

2. The method of manufacturing a semiconductor element mounted wiring board, according to claim 1, further comprising forming a pad on a surface of the metal plate, the surface being opposite to the surface of the metal plate attached to the support base member,
    wherein the insulating layer is formed to also cover the pad on the metal plate in the fabricating of the semiconductor element sealed substrate, and
    when the conducive bump is formed on the outermost wiring layer in the fabricating of the wiring substrate, another conductive bump is formed on a portion of the outermost wiring layer, the portion corresponding to a position of the pad in the semiconductor element sealed substrate.

3. The method of manufacturing a semiconductor element mounted wiring board, according to claim 1, further comprising, after the removing of the support base member and the temporary substrate, forming a protection film on the wiring layer and the insulating layer both exposed on a surface of the structure, while exposing a portion of a pad of the wiring layer, the surface of the structure being opposite to a surface where the semiconductor element is exposed.

4. The method of manufacturing a semiconductor element mounted wiring board, according to claim 2, wherein the pad is formed for external connection.

5. The method of manufacturing a semiconductor element mounted wiring board, according to claim 3, further comprising, after the forming of the protection film, selectively removing the metal plate.

6. A method of manufacturing a semiconductor element mounted wiring board, comprising:
    preparing a metal plate with an opening portion formed therein and then attaching the metal plate to a surface of a support base member;
    mounting a semiconductor element on the surface of the support base member in a face-up position, the surface of the support base member corresponding to the opening portion of the metal plate;
    forming an insulating layer so as to cover the metal plate and the semiconductor element on the support base member, then forming, in the insulating layer, a conductive via to be connected to an electrode terminal of the semiconductor element, and thereby fabricating a semiconductor element sealed substrate;
    fabricating a wiring substrate by stacking wiring layers and insulating layers on a temporary substrate, and causing the outermost wiring layer to be exposed;
    stacking the semiconductor element sealed substrate and the wiring substrate on each other in such a way that the conductive via provided on the electrode terminal of the semiconductor element and a corresponding pad on the outermost wiring layer face each other, and then connecting the conductive via to the pad; and
    removing the support base member and the temporary substrate.

7. The method of manufacturing a semiconductor element mounted wiring board, according to claim 6, further comprising, after the removing of the support base member and the temporary substrate, forming a protection film on the wiring layer and the insulating layer both exposed on a surface of the structure, while exposing a portion of a pad of the wiring layer, the surface of the structure being opposite to a surface where the semiconductor element is exposed.

8. The method of manufacturing a semiconductor element mounted wiring board, according to claim 7, further comprising, after the forming of the protection film, selectively removing the metal plate.

* * * * *